(12) United States Patent
Hata (10) Patent No.: US 6,868,475 B2
(45) Date of Patent: Mar. 15, 2005

(54) CONTENT ADDRESSABLE MEMORY HAVING DATA WIDTH EXTENSION CAPABILITY

(75) Inventor: Ryuichi Hata, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 226 days.

(21) Appl. No.: 10/026,880

(22) Filed: Dec. 27, 2001

(65) Prior Publication Data

US 2002/0080665 A1 Jun. 27, 2002

(30) Foreign Application Priority Data

Dec. 27, 2000 (JP) ........................................ 2000-397268

(51) Int. Cl.[7] ............................................. G06F 12/08
(52) U.S. Cl. ........................ 711/108; 711/172; 711/171
(58) Field of Search ............................... 711/108, 172, 711/171, 173

(56) References Cited

U.S. PATENT DOCUMENTS

| | | | | |
|---|---|---|---|---|
| 6,236,585 B1 | * | 5/2001 | Hill | 365/49 |
| 6,526,474 B1 | * | 2/2003 | Ross | 711/108 |
| 6,553,453 B1 | * | 4/2003 | Gibson et al. | 711/108 |
| 6,611,445 B2 | * | 8/2003 | Kanazawa et al. | 365/49 |

FOREIGN PATENT DOCUMENTS

JP    2001-056392    * 9/2002 ........... G11C/15/04

* cited by examiner

Primary Examiner—Mano Padmanabhan
Assistant Examiner—Midys Inoa
(74) Attorney, Agent, or Firm—Oliff & Berridge, PLC (57) ABSTRACT

A content addressable memory having a function for extending a data width to a plurality of words includes an entry configuration set unit which sets the number of words to form one entry, and a logical-segment-to-physical-segment converting circuit for converting the logical segments in one entry to the physical segments according to the setting of the entry configuration. The content addressable memory further includes a word circuit chain having the maximum number of one-word circuits belonging to each physical block which are combined to form one entry. The one-word circuits have CAM words associated therewith, and are connected in series over the physical block. A group of the words at the same number in entries where one entry is composed of a plurality of words forms a logical segment. The thus constructed content addressable memory is capable of an AND search for the words of which the addresses are apart from each other in one entry, or allows the words within one entry to be searched in an arbitrary order. Furthermore, a search operation for a portion of the words in one entry is used to do a match search for the entry. In addition, unintended word search is prevented, thereby reducing the power consumption.

20 Claims, 9 Drawing Sheets

|  | LOGICAL SEGMENT 0 |
|---|---|
| ENTRY 0 | WORD 0(PS0) |
| ENTRY 1 | WORD 1(PS1) |
| ENTRY 2 | WORD 2(PS2) |
| ENTRY 3 | WORD 3(PS3) |

PS0 = PHYSICAL SEGMENT 0
PS1 = PHYSICAL SEGMENT 1
PS2 = PHYSICAL SEGMENT 2
PS3 = PHYSICAL SEGMENT 3

FIG. 2B

|  | LOGICAL SEGMENT 0 | LOGICAL SEGMENT 1 |
|---|---|---|
| ENTRY 0 | WORD 0(PS0) | WORD 1(PS1) |
| ENTRY 1 | WORD 2(PS2) | WORD 3(PS3) |
| ENTRY 2 | WORD 4(PS0) | WORD 5(PS1) |
| ENTRY 3 | WORD 6(PS2) | WORD 7(PS3) |

FIG. 2C

|  | LOGICAL SEGMENT 0 | LOGICAL SEGMENT 1 | LOGICAL SEGMENT 2 | LOGICAL SEGMENT 3 |
|---|---|---|---|---|
| ENTRY 0 | WORD 0(PS0) | WORD 1(PS1) | WORD 2(PS2) | WORD 3(PS3) |
| ENTRY 1 | WORD 4(PS0) | WORD 5(PS1) | WORD 6(PS2) | WORD 7(PS3) |
| ENTRY 2 | WORD 8(PS0) | WORD 9(PS1) | WORD 10(PS2) | WORD 11(PS3) |
| ENTRY 3 | WORD 12(PS0) | WORD 13(PS1) | WORD 14(PS2) | WORD 15(PS3) |

FIG. 3

| ENTRY CONFIGURATION | ES <3:0> | DESCRIPTION |
|---|---|---|
| 1 WORD | 1111 | PHYSICAL SEGMENT 0 TO 3 ARE ENTRY REPRESENTATIVE SEGMENTS |
| 2 WORDS | 1010 | PHYSICAL SEGMENT 3 AND 1 ARE ENTRY REPRESENTATIVE SEGMENTS |
| 4 WORDS | 1000 | PHYSICAL SEGMENT 3 IS AN ENTRY REPRESENTATIVE SEGMENT |

FIG. 4

| ENTRY CONFIGURATION | LSS <1:0> | DESCRIPTION | PSS <3:0> | DESCRIPTION |
|---|---|---|---|---|
| 1 WORD | 0 0 | LOGICAL SEGMENT 0 | 1111 | PHYSICAL SEGMENT 0 TO 3 ARE SEARCHED |
| 2 WORDS | 0 0 | LOGICAL SEGMENT 0 | 0101 | PHYSICAL SEGMENT 0 AND 2 ARE SEARCHED |
| 2 WORDS | 0 1 | LOGICAL SEGMENT 1 | 1010 | PHYSICAL SEGMENT 1 AND 3 ARE SEARCHED |
| 4 WORDS | 0 0 | LOGICAL SEGMENT 0 | 0001 | PHYSICAL SEGMENT 0 IS SEARCHED |
| 4 WORDS | 0 1 | LOGICAL SEGMENT 1 | 0010 | PHYSICAL SEGMENT 1 IS SEARCHED |
| 4 WORDS | 1 0 | LOGICAL SEGMENT 2 | 0100 | PHYSICAL SEGMENT 2 IS SEARCHED |
| 4 WORDS | 1 1 | LOGICAL SEGMENT 3 | 1000 | PHYSICAL SEGMENT 3 IS SEARCHED |

| GROUP NO. \ ATTRIBUTE | I | II | III | IV |
|---|---|---|---|---|
| 1 | A | B | C | D |
| 2 | C | F | G | H |
| 3 | J | K | L | M |
| 4 | C | A | B | D |
| ⋮ | ⋮ | ⋮ | ⋮ | ⋮ |

US 6,868,475 B2

CONTENT ADDRESSABLE MEMORY HAVING DATA WIDTH EXTENSION CAPABILITY

BACKGROUND OF THE INVENTION

1. Field of Invention

The present invention generally relates to a content addressable memory having a function for extending the width of data to be searched to a plurality of words. More particularly, the present invention relates to a content addressable memory having such a mechanism that, if a plurality of words are combined to form one entry, and each of the words constituting the entry is searched to detect a match for all the words, then a match for one entry is detected.

2. Description of Related Art

A content addressable memory (CAM) includes a plurality of memory words arranged (hereinafter referred to as "words") each having digital data therein. The CAM receives search data, and searches for a memory word containing digital data of the bit pattern matched with the entire portion or a predetermined portion of the bit pattern of the received search data.

Figure 8:
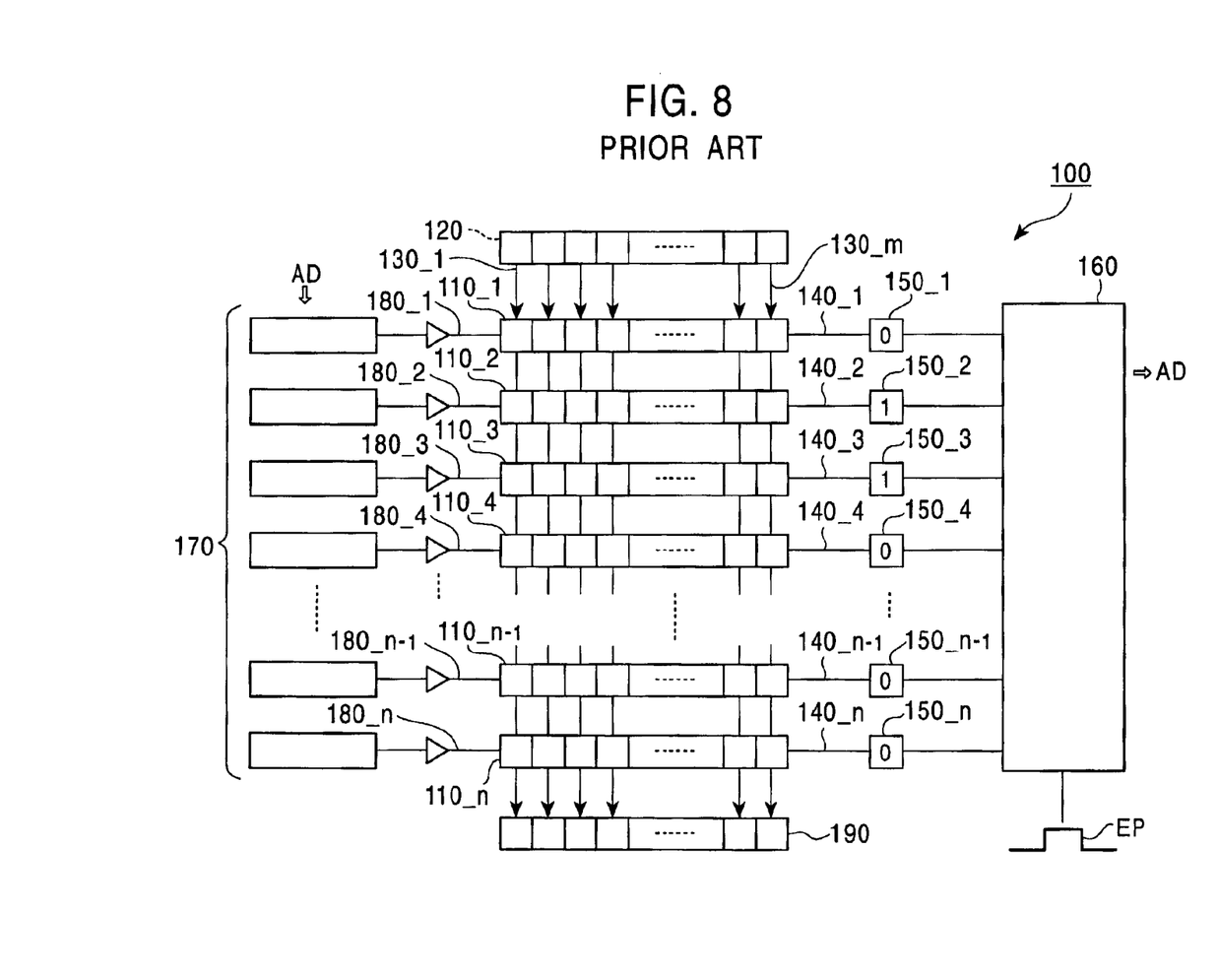
FIG. 8 is a circuit block diagram of the fundamental structure of a conventional content addressable memory.

FIG. 8 is a circuit block diagram of the fundamental structure of a conventional CAM 100. The CAM 100 includes a great number of words 110_1, 110_2, . . . , and 110_n composed of memory cells of m bits which are arranged side-by-side in the horizontal direction as viewed in FIG. 8 to form one word. The CAM 100 farther includes a search data register 120 which receives and latches the search data of one word. The search data latched by the search data register 120 is supplied to the memory cells that form each word via search bit lines 130_1, 130_2, . . . , and 130_m, where the entire portion or a predetermined portion of the bit pattern of the search data is compared to the bit pattern of the portion corresponding to that bit pattern among the storage data stored in each word to detect a match or mismatch. A match signal of logic '1' is output onto the match line corresponding to the word matched with the bit pattern among match lines 140_1, 140_2, . . . , and 140_n that correspond to the words 110_1, 110_2, . . . , and 110_n, respectively. The remaining match lines have logic '0'. As used herein, logic '1' indicates a power supply potential, and logic '0' indicates a ground potential.

The signals output on the match lines 140_1, 140_2, . . . , and 140_n are stored in flag registers 150_1, 150_2, . . . , and 150_n, respectively. As an example shown in FIG. 8, it is assumed that '0', '1', '1', '0', . . . , '0', and '0' are stored in the flag registers 150_1, 150_2, 150_3, 150_4, . . . , 150_n–1, and 150_n, respectively. The signals stored in the flag registers 150_1, 150_2, . . . , and 150_n are input to a priority encoder 160. An encode pulse EP is also input to the priority encoder 160. Each time an encode pulse EP is input, an address signal AD corresponding to a higher priority flag register in the flag registers (the flag registers 150_2 and 150_3 in this example) that store a signal of logic '1' is sequentially output according to a predetermined priority. Herein, the smaller the suffix, the higher the priority. Therefore, when one encode pulse EP is input, the memory address corresponding to the flag register 150_2 is output. The address signal AD output from the priority encoder 160 is then input to an address decoder 170, if necessary. The address decoder 170 decodes the input address signal AD, and outputs an access signal (a signal of logic '1' in this example) onto a word line (the word line 180_2 in this example) corresponding to the input address signal AD among word lines 180_1, 180_2, . . . , and 180_n corresponding to the words 110_1, 110_2, . . . , and 110_n, respectively. The data stored in the word 110_2 corresponding to the word line 180_2 on which the access signal is output is read by an output register 190.

When another encode pulse EP is input, the address of the word 110_3 corresponding to the flag register 150_3 is obtained. Accordingly, the CAM 100 is a memory which searches the storage data which is stored in the words 110_1, 110_2, . . . , and 110_n by using the entire portion or a predetermined portion of the search data to obtain the address of the word containing the storage data matched therewith and to read the entire data which is stored in that word, if necessary.

Figure 9:
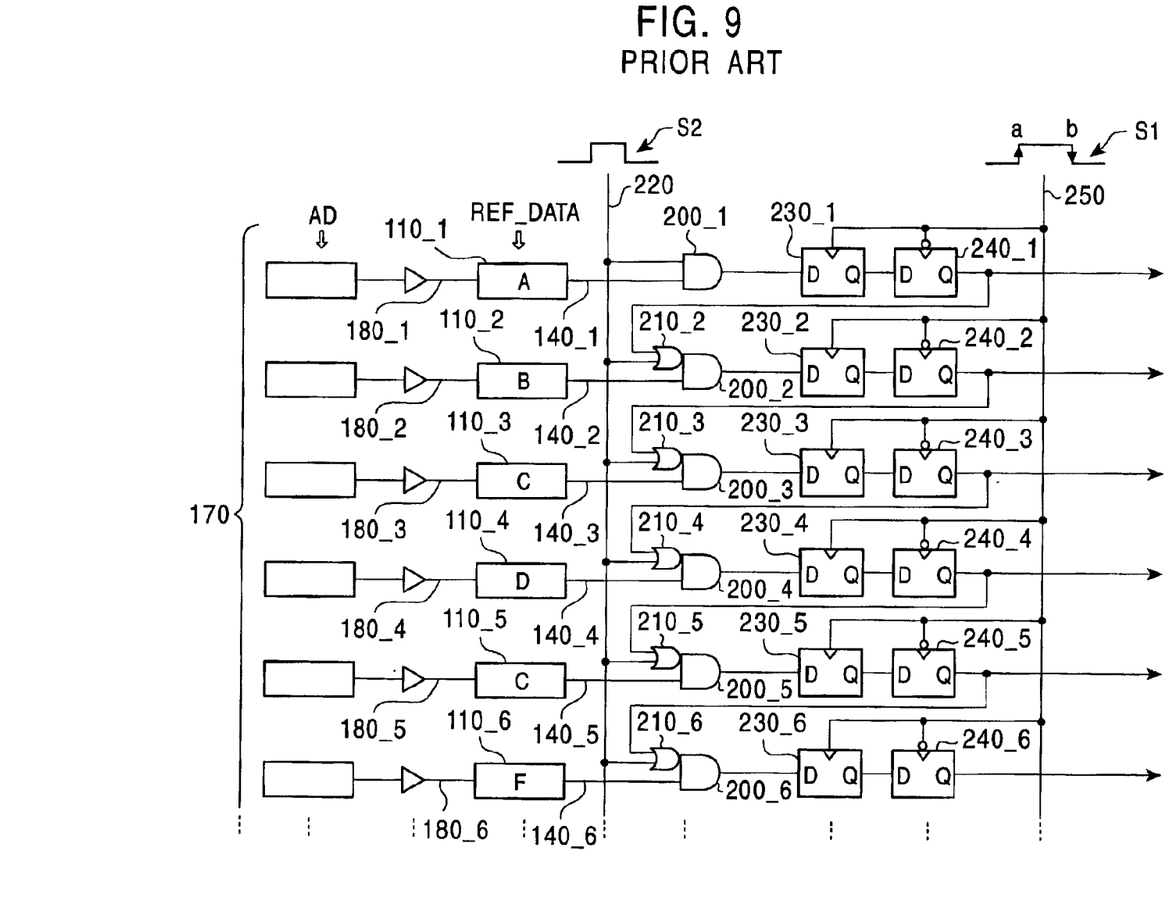
FIG. 9 is a block diagram of a conventional content addressable memory having a data width extension capability.

In the context of a content addressable memory having such a fundamental structure, there has been proposed a technique to extend the width of data to be searched for a match to two or more words. FIG. 9 is a block diagram of an example of the content addressable memory having a data width extension capability, as described in Japanese Patent Application Publication No. Hei 7-226091. The same components as those in the content addressable memory shown in FIG. 8 are designated by the same reference numerals, and a description thereof is not repeated.

The match lines 140_1, 140_2, . . . which extend from the words 110_1, 110_2, . . . are connected to first input terminals of AND gates 200_1, 200_2, . . . , respectively. Second input terminals of the AND gates 200_2, 200_3, . . . are connected to the output terminals of OR gates 210_2, 210_3, . . . , respectively, and first input terminals of the OR gates 210_2, 210_3, . . . are connected to a first search control line 220. However, the OR gate corresponding to the uppermost AND gate 200_1 is omitted in FIG. 9, and a second input terminal of the AND gate 200_1 is directly connected to the first search control line 220.

The output terminals of the AND gates 2001, 2002, . . . are connected to the data input terminals of first flag registers 230_1, 230_2, . . . , respectively. The output terminals of the first flag registers 230_1, 230_2, . . . are connected to the input terminals of second flag registers 240_1, 240_2, . . . , respectively. The output terminals of the second flag registers 240_1, 240_2, . . . are connected to the priority encoder 160 shown in FIG. 8 (not shown in FIG. 9), and are also connected to second input terminals of the OR gates 210_2, 210_3, . . . , respectively, which correspond to the memory words one stage below in FIG. 9.

A match result latch signal S1 which is output on a match result latch control line 250 is input to the clock terminals of each first register and each second flag register. The input data which is input from the data input terminals D of each first and second registers is latched according to the match result latch signal S1. Specifically, the input data is latched by each first flag register at the rise time "a" of the match result latch signal S1, and the input data is latched by each second flag register at the fall time "b" of the match result latch signal S1.

A match search operation for the thus constructed content addressable memory is now described. It is assumed, as shown in FIG. 9, that the storage data A, B, C, D, C, F, . . . are stored in the memory words 110_1, 110_2, 110_3, 110_4, 110_5, 110_6, . . . , respectively. To search the storage data individually rather than in combination, a first search timing signal S2 is output onto the first search control line 220 at the time of inputting search data REF_DATA for the purpose of search operation. Given that data 'B' is input as search data REF_DATA, then a match signal of logic '1' is output onto the match line 140_2 corresponding to the word 110_2 which stores the data 'B', and is input to the AND gate 200_2. In addition, the first search timing signal S2 is also input to the AND gate 200_2 via the OR gate 210_2. Thus, a signal of logic '1 ' is output from the AND gate 200_2. At this time, a signal of logic '0' is output onto the remaining match lines, and the corresponding AND gates 200_1, 200_3, 200_4, . . . thus output a signal of logic '0'.

The signal of logic '1' output from the AND gate 200_2 is latched by the first flag register 230_2 at the rise time "a" of the match result latch signal S1 output on the match result latch control line 250, and is latched by the second flag register 240_2 at the subsequent fall time "b" of the match result latch signal S1.

A signal of logic '0' is latched by the remaining first flag registers 230_1, 230_3, 230_4, . . . at each timing at which the signal of logic '1' is latched by the first flag register 230_2, and is then latched by the remaining second flag registers 240_1, 240_3, 240_4, . . . at each timing at which the signal of logic '1' is latched by the second flag register 240_2. Accordingly, the signals of logic '0', '1', '0', . . . which are latched by the second flag registers 240_1, 240_2, 240_3, . . . are input to the priority encoder 160 shown in FIG. 8, so that the address signal AD of the memory word 110_2 can be obtained.

The search operation for data of the extended width is now described. In this example, the data of two words composed of data 'B' and data 'C' is searched.

First, data 'B' is searched in the same manner as described above. Thus, a signal of logic '1' is latched by the first and second flag registers 230_2 and 240_2 corresponding to the word 110_2. Next, data 'C' is input as search data REF_DATA to do a search. At this time, the first search timing signal S2 is not output on the first search control line 220, and the first search control line 220 is maintained in the state of logic '0'. When data 'C' is input as search data REF_DATA to do a search, a match signal of logic '1' is output onto the match lines 140_3 and 140_5 corresponding to the memory words 110_3 and 110_5, respectively. Since the signal of logic '1' latched by the second flag register 240_2 is input to the OR gate 210_3, the match signal on the match line 140_3 is passed through the AND gate 200_3, and therefore a signal of logic '1' indicating a match is latched by the first and second flag registers 230_3 and 240_3. On the other hand, since the signal of logic '0' latched by the second flag register 240_4 is input to the OR gate 210_5, the match signal on the match line 140_5 is interrupted by the AND gate 200_5, and therefore a signal of logic '0' indicating a mismatch is latched by the first and second flag registers 230_5 and 240_5. In this way, a data match of two words composed of a pair of data 'B' and data 'C' is detected. A data match of three or more words is detected in the same way.

Although the content addressable memory shown in FIG. 9 has a data width extension capability, the data of extended two words, three words or the like must be stored in adjacent memory words in a predetermined order. That is, if a plurality of data to be searched are stored in memory words which are apart from each other or are reversely ordered, e.g., data 'B' is stored after data 'C', a data match of a plurality of combined data cannot be detected.

Figure 10:
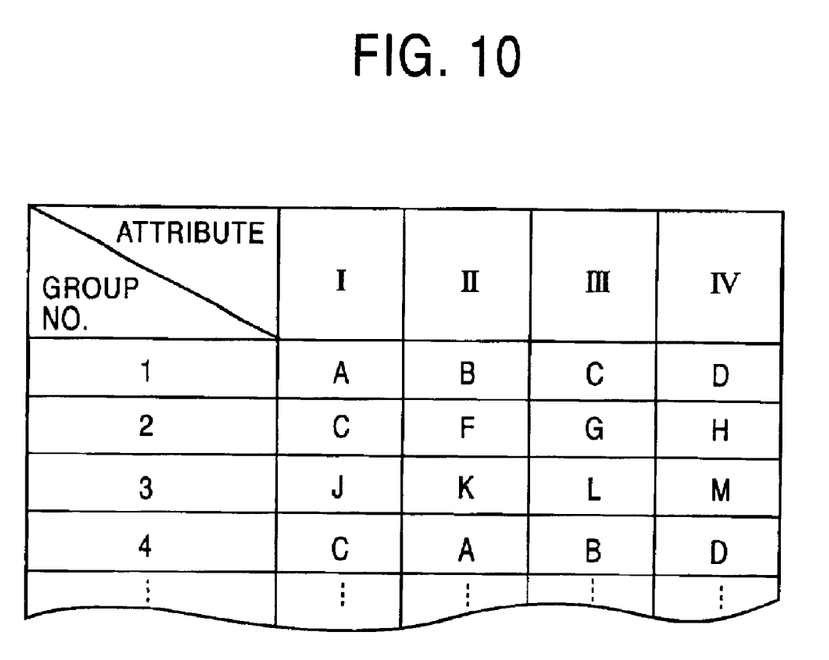
FIG. 10 is a table showing an example of data having the group structure.

The data structure which requires such a search operation is shown in FIG. 10. FIG. 10 illustrates the data structure in which a data group is composed of sets of four pieces of data which are given attributes I, II, III, and IV, respectively. For clarification of the data group and attribute concept, as an example, the data groups in group numbers 1, 2, 3, 4, and so on include data belonging to an individual, indicating the name in attribute I, the date of birth in attribute II, the address in attribute III, etc.

Suppose that the data groups comprising a plurality of data given attributes I, II, III, and IV are stored in the content addressable memory for the purpose of search operation. For example, if the data group in group No. 1 is searched, in some cases, a user may desire to search for data 'A' and data 'B' in this order to read the remaining data 'C' and 'D' in the data group containing a data match, or, for example, may desire to search for data 'A' and data 'D' to read the remaining data 'B' and 'C', or to search for data 'B' before data 'A'.

However, the content addressable memory (see FIG. 9) having a data width extension capability cannot perform such a search operation. Furthermore, if data 'A' and data 'B' are searched for, this content addressable memory cannot distinguish a pair of the data 'A' in the column of attribute I and the data 'B' in the column of attribute II in the row of group No. 1 from a pair of the data 'A' in the column of attribute II and the data 'B' in the column of attribute III in the row of group No. 4. For example, even though the information of attributes III and IV of a particular person where a match is found between the "name" information of attribute I and the "date of birth" information of attribute II is desired, noise other than the required information, such as a further match detection between a pair of attributes II and III, might be generated.

The aforementioned content addressable memory further has problems in view of the power consumption. For a search operation for a data group having the data structure shown in FIG. 10, when the data group is searched for a particular attribute, the memory words containing other attributes do not need to be searched, but be searched, as well as the memory word containing the particular attribute. In general, the power consumed by a content addressable memory is largely consumed by the search data lines and match lines. It is therefore important that unnecessary operations for these lines be reduced in order to reduce the power consumption.

For simplification of illustration, in the foregoing content addressable memory, memory words are arranged in a one-dimensional manner. However, a content addressable memory having a large capacity has a two-dimensional structure including a plurality of memory word blocks each being arranged in a one-dimensional manner, and priority encoders in the vertical and horizontal directions in the figure. The content addressable memory having such a two-dimensional structure is well known in the art, and a further illustration or description thereof is omitted herein.

Accordingly, as described above, a conventional content addressable memory having one entry (in which a plurality of memory words are combined in order to form one data group) which is extended to a plurality of words is associated with the following problems:

A match search (AND search) cannot be applied to words of which the addresses are apart from each other in one entry.

The words constituting an entry cannot be searched in an arbitrary order.

A memory word does not have the ability to distinguish data attributes, possibly resulting in an unnecessary search result in some cases.

All the words are always to be searched, thereby significantly increasing the power consumption.

SUMMARY OF THE INVENTION

Accordingly, in order to overcome the foregoing problems, it is an object of the present invention to provide a content addressable memory capable of searching one entry composed of plurality of words in an arbitrary word order, while preventing unintended word search, thereby significantly reducing the power consumption.

As used herein, a group of the memory words at the same number in entries where one entry is composed of a plurality of words is hereinafter referred as a logical segment.

To this end, in one aspect of the present invention, there is provided a content addressable memory having a function for extending a data width, comprising: a plurality of memory blocks having a plurality of CAM words; physical segments each including one or more memory blocks; entry configuration set means for setting the number of CAM words which are combined to form one entry; and a logical-segment-to-physical-segment converting circuit for converting logical segments within one entry to the physical segments according to the setting of the entry configuration set means.

In another aspect of the present invention, there is provided a content addressable memory having a function for storing a plurality of entries composed of a combination of a plurality of words and searching the entries for each logical segment, comprising: a plurality of memory blocks including a plurality of CAM words for storing the data of one word within the entries; and physical segments each including one or more memory blocks, each physical segment including: a search bit line; a plurality of one-word circuits which search for a match between the data stored in the CAM word and search data driven on the search bit line to output a match flag which is a match or mismatch result; and a search bit line driver for driving the search bit line according to the search data, wherein, when search operation is executed (or performed), only the search bit line in a physical segment to be searched is driven by the search bit line driver.

Preferably, each of the physical segments includes a match flag control signal generating circuit for generating a match flag control signal which is a timing signal for capturing and holding a match flag output from the one-word circuit, and, when the match is detected, the match flag control signal only in a physical segment to be searched is generated.

Preferably, the content addressable memory further comprises: an entry configuration set register for setting the number of words which are combined to form a entry; and a logical-segment-to-physical-segment converting circuit for converting a logical segment to be searched to a physical segment to be searched according to the setting of the entry configuration set register, wherein one or a plurality of words are combined to form each of the entries.

Preferably, each of the one-word circuits includes a CAM word having a plurality of CAM cells, and word logic for processing a match flag output from the CAM word; the word logic includes a match flag register for holding the match flag, an AND chain processing the match flags of the plurality of words coupled each other in the entry, and an entry match output circuit for outputting a match flag for the entries; the word having the first address or the final address in the plurality of words within each of the entries is the representative word of each corresponding entry; if a word in each of the entries is not the representative word, an AND result of the match flags of that word and the previous word is output from the AND chain; and if a word in each of the entries is the representative word, the AND chain is logically separated from the next word, and an AND result of the plurality of words within each corresponding entry is output as the entry match output from the entry match output.

Preferably, the content addressable memory further comprises an initialization unit for initializing all the match flag registers to be in a match state before a first match search.

Preferably, the CAM cells are mismatch-detection CAM cells for maintaining all the match flags in a physical segment not to be searched in the initial state or a match state and for capturing the match flags in the corresponding match flag registers.

In another aspect of the present invention, there is provided a content addressable memory comprising: a plurality of memory blocks having a plurality of one-word circuits; physical segments each including one or more memory blocks; entry configuration set means for setting the number of CAM words which are combined to form one entry; a logical-segment-to-physical-segment converting circuit for converting logical segments constituting one entry to the physical segments according to the setting of the entry configuration set means; and a word circuit chain having the maximum number of corresponding one-word circuits belonging to each physical block which are combined to form one entry, the one-word circuits being connected in series across the physical block.

DETAILED DESCRIPTION OF PREFERRED EMBODIMENTS

Figure 1:
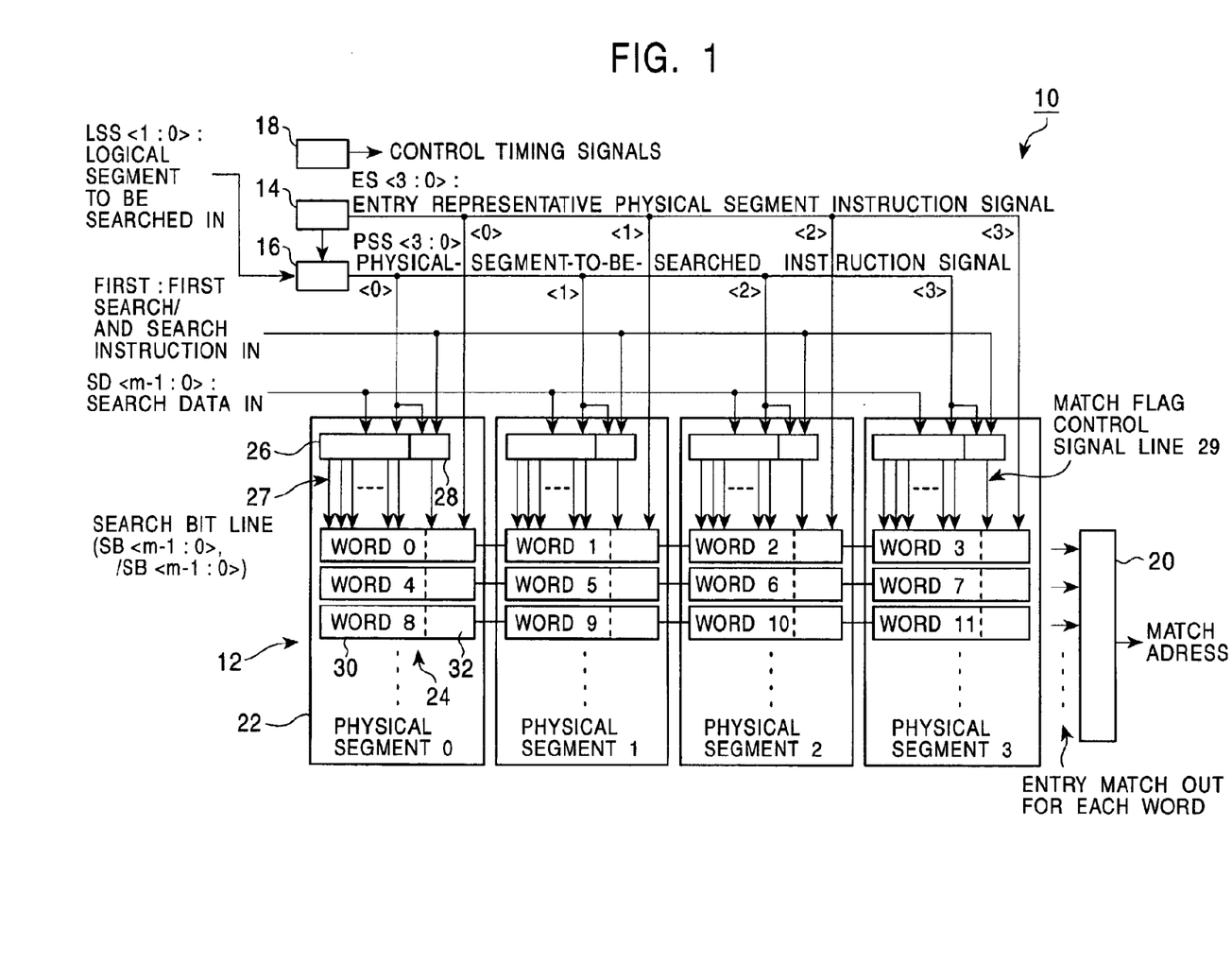
FIG. 1 is a schematic structural view of a content addressable memory according to the present invention.

A content addressable memory according to the present invention is described in detail with reference to the drawings taken in conjunction with the preferred FIG. 1 is a schematic block diagram of the internal structure of a content addressable memory 10 according to the present invention. The content addressable memory 10 is a memory which can be set so that one entry is composed of one word (equal to m bits, for example, m=72), or a combination of two or up to four words. The content addressable memory 10 includes a memory array 12, an entry set register 14 for setting the entry configuration, a logical-segment-to-physical-segment converting circuit 16, a timing generating circuit 18, and a priority encoder 20. For simplification of illustration, one entry can be composed of a combination of up to four words in the following description, but may be composed of more than four words, for example, up to 16 words.

In the content addressable memory 10 shown in FIG. 1, the memory array 12 includes four (at least the maximum number of words combined) memory blocks 22 each having N words (N=1, 2, 3, ... ). In other words, the memory array 12 includes a total of 4N words. In the content addressable memory 10, therefore, the total number of entries is 4N, 2N, or N if one entry is composed of one word, two words, or four words, respectively.

The words in the memory array 12 are designated by addresses 4n, 4n+1, 4n+2, and 4n+3, where n=0, 1, 2, and so on. In this illustration, a memory block 22 containing N words designated by address 4n is referred to as "physical segment 0". Likewise, memory blocks 22 containing N words designated by addresses 4n+1, 4n+2, and 4n+3 are referred to as "physical segment 1", "physical segment 2", and "physical segment 3", respectively. Although one memory block corresponds to one physical segment herein, the present invention is not limited thereto. One physical segment may be composed of a plurality of memory blocks, and the memory blocks belonging to one physical segment may be physically apart from each other.

The memory block 22 of each of the physical segments 0 to 3 includes one-word circuits 24 of N words, a search bit line driver 26, search bit lines 27, a match flag control signal generating circuit 28, and a match flag control signal line 29. A data bit line for inputting and outputting storage data to and from each word is not directly related to the present invention, and is not described herein. The data bit line may be common to or separated from the search bit lines. The search bit lines comprise a pair of search bit lines in this illustration, but may alternatively comprise a single search bit line instead of the pair.

In the memory block 22, each one-word circuit 24 stores the data of one word, searches for a match between the stored data and the search data, and outputs a match or mismatch result (match flag). The one-word circuit 24 includes CAM word 30 composed of CAM cells of m bits, and word logic 32 for processing the match line outputs from the CAM word 30. The one-word circuit 24 is described in detail later.

In response to a physical-segment-to-be-searched instruction signal PSS<3:0> input from the logical-segment-to-physical-segment converting circuit 16, the search bit line driver 26 in the memory block 22 of a physical segment to be searched drives a pair of search bit lines SB<m−1:0> and /SB<m−1:0> according to search data SD<m−1:0> externally supplied to the content addressable memory 10.

The physical-segment-to-be-searched instruction signal PSS<3:0> instructs the memory block 22 of a physical segment to be searched. This signal is input from the logical-segment-to-physical-segment converting circuit 16 to the memory block 22 of each of the corresponding physical segments 0 to 3.

In addition to the physical-segment-to-be-searched instruction signal and the search data, a search bit line output timing signal (not shown) which instructs a timing of driving the search bit lines is also input to the search bit line driver 26 from the timing generating circuit 18. The search bit lines 27 driven by the search bit line driver 26 are connected to the CAM words 30 of all the one-word circuits 24 in the memory block 22 of each corresponding physical segment.

The content addressable memory 10 is provided with the search bit line driver 26 for each memory block 22, so that the driving of the search bit lines 27 can be controlled in each memory block 22. Accordingly, if one entry is composed of a combination of a plurality of words, the search bit lines 27 in the memory block 22 of a physical segment to be searched can only be driven, while the search bit lines 27 in the memory block 22 of a physical segment not to be searched are not driven, thereby significantly reducing the power consumption.

The match flag control signal generating circuit 28 in the memory block 22 generates a match flag control signal which is a timing signal of holding, in the word logic 32, the match flag output onto the match line from the CAM word 30 in each one-word circuit 24.

A match flag control timing signal which instructs a timing of holding the match line output is input to the match flag control signal generating circuit 28 from the timing generating circuit 18. A first search/AND search instruction signal (FIRST) which instructs either a first search or an AND search is input to the match flag control signal generating circuit 28 from a unit external to the content addressable memory 10. The above-noted physical-segment-to-be-searched instruction signal PSS is also input from the logical-segment-to-physical-segment converting circuit 16.

In this embodiment, the match flag control signal generating circuit 28 generates a match flag control signal for the memory blocks 22 of all the physical segments if a first search is instructed (FIRST='1'). If an AND search is instructed (FIRST='0'), it generates a match flag control signal only for the memory block 22 of a physical segment to be searched. The match flag control signal is supplied to the word logic 32 of all the one-word circuits 24 in the memory block 22 of each corresponding physical segment.

The entry configuration set register 14 and the logical-segment-to-physical-segment converting circuit 16 in the content addressable memory 10 function to logically reconstruct the memory array 12 composed of the memory blocks 22 of the physical segments 0 to 3.

Figure 2A:
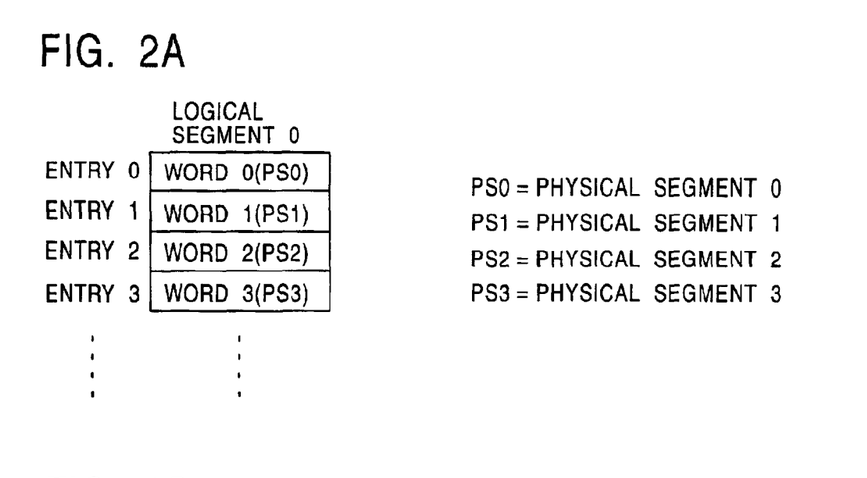
FIGS. 2A to 2C are conceptual views of an example relationship between physical segments and logical segments.
Figure 2B:
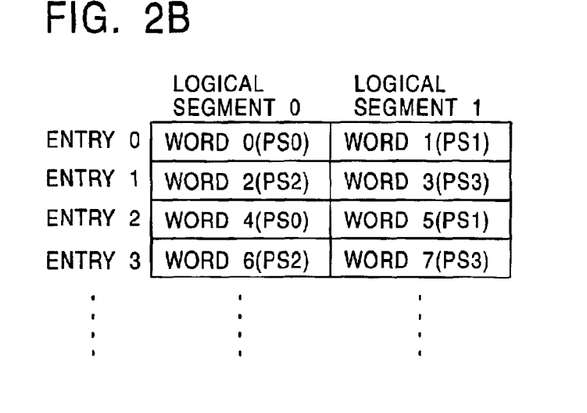
Figure 2C:
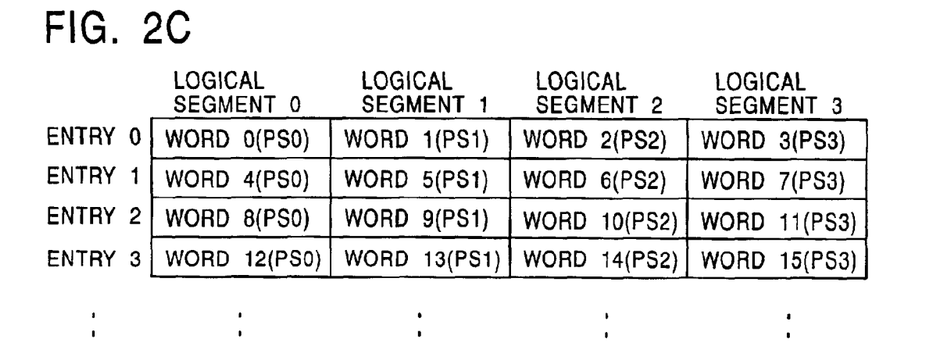

In this embodiment, if one entry is composed of one word (see FIG. 2A), all the physical segments 0 to 3 correspond to logical segment 0. If one entry is composed of a combination of two words (see FIG. 2B), the physical segments 0 and 2 correspond to logical segment 0, and the physical segments 1 and 3 correspond to logical segment 1. If one entry is composed of a combination of four words (see FIG. 2C), the physical segments 0 to 3 correspond to logical segments 0 to 3, respectively.

The entry configuration set register 14 sets the number of words having sequential addresses which are combined to form one entry. Based on this set value, an entry representative physical segment instruction signal ES<3:0> is output, and is then supplied to the word logic 32 of all the one-word circuits 24 in the memory block 22 of each corresponding physical segment. This signal is also supplied to the logical-segment-to-physical-segment converting circuit 16.

Figure 3:
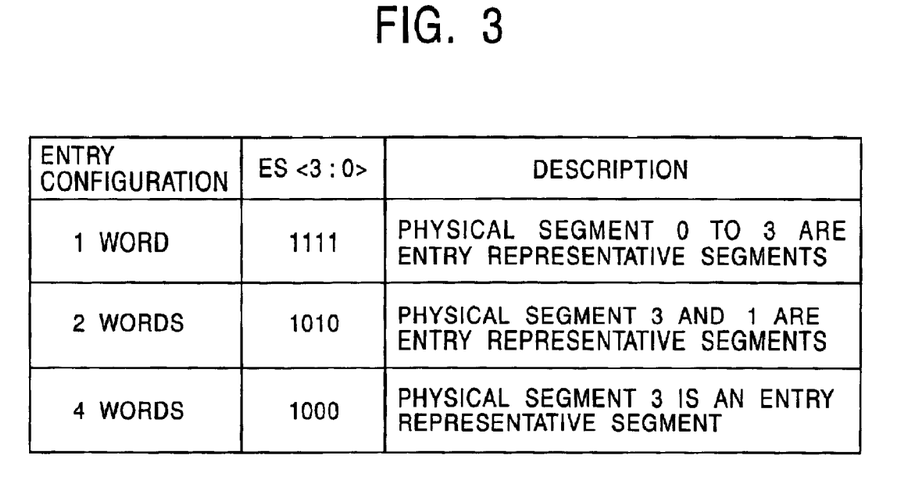
FIG. 3 is a table showing an example relationship between the entry configuration and the entry representative physical segment instruction signal.

FIG. 3 is a table showing an example relationship between the entry configuration and the entry representative physical segment instruction signal. As shown in the table of FIG. 3, if one entry is composed of one word, the entry configuration set register 14 outputs an entry representative physical segment instruction signal ES<3:0>='1111', in which all the memory blocks 22 of the physical segments 0 to 3 are the entry representative physical segments.

If one entry is composed of a combination of two words, an entry representative physical segment instruction signal ES<3:0>='1010' is output, in which the memory blocks 22 of the physical segments 3 and 1 are the entry representative physical segments. If one entry is composed of a combination of four words, an entry representative physical segment instruction signal ES<3:0>='1000' is output, in which the memory block 22 of the physical segment 3 is the entry representative physical segment.

In response to the setting of the entry configuration set register 14, the logical-segment-to-physical-segment converting circuit 16 converts logical-segment-to-be-searched signal LSS<1:0>, which is externally input to the content addressable memory 10, to and outputs a physical-segment-to-be-searched instruction signal PSS<3:0>. The physical-segment-to-be-searched instruction signal PSS<3:0> is supplied to the search bit line driver 26 and the match flag control signal generating circuit 28 in the memory block 22 of each corresponding physical segment.

Figure 4:
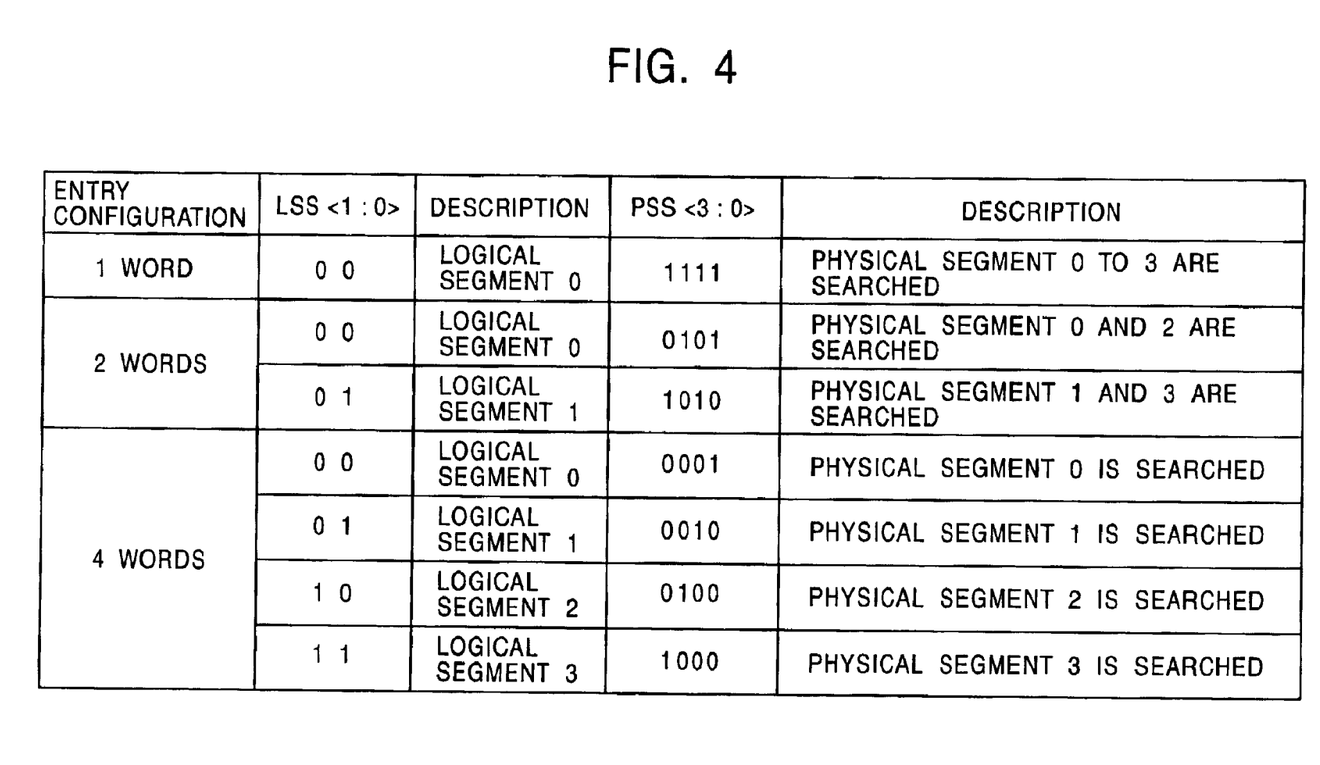
FIG. 4 is a table showing an example relationship among the entry configuration, the logical-segment-to-be-searched position, and the physical-segment-to-be-searched designation signal.

FIG. 4 is a table showing an example relationship among the entry configuration, the logical-segment-to-be-searched signal, and the physical-segment-to-be-searched instruction signal.

As shown in the table of FIG. 4, if one entry is composed of one word, once the logical segment 0 is designated according to a logical-segment-to-be-searched signal LSS<1:0>='00', a physical-segment-to-be-searched instruction signal PSS<3:0>='1111' is output. Then, all the memory blocks 22 of the physical segments 0 to 3 are to be searched.

If one entry is composed of a combination of two words, once the logical segment 0 is designated according to a logical-segment-to-be-searched signal LSS<1:0>='00', a physical-segment-to-be-searched instruction signal PSS<3:0>='0101' is output. Then, the memory blocks 22 of the physical segments 0 and 2 are to be searched. Once the logical segment 1 is designated according to a logical-segment-to-be-searched signal LSS<1:0>='01', a physical-segment-to-be-searched instruction signal PSS<3:0>='1010' is output. Then, the memory blocks 22 of the physical segments 1 and 3 are to be searched.

If one entry is composed of a combination of four words, once the logical segment 0 is designated according to a logical-segment-to-be-searched signal LSS<1:0>='00', a physical-segment-to-be-searched instruction signal PSS<3:0>='0001' is output. Then, the memory block 22 of the physical segment 0 is to be searched. Likewise, once the logical segments 1, 2, and 3 are designated according to logical-segment-to-be-searched signals LSS<1:0>='01', '10', and '11', respectively, physical-segment-to-be-searched instruction signals PSS<3:0>='0010', '0100', and '1000' are output, respectively, and then the memory blocks 22 of the physical segments 1, 2, and 3 are to be searched, respectively.

The timing generating circuit 18 in the content addressable memory 10 generates various signals such as an encode-start signal which is supplied to the priority encoder 20 described just below, in addition to the search bit line output timing signal and the match flag control timing signal. The various signals generated by the timing generating circuit 18 are supplied to corresponding elements. For clarification of illustration, the connection of the signals output from the timing generating circuit 18 is omitted in FIG. 1.

The priority encoder 20 sequentially encodes and outputs the addresses of the words where a match is detected according to a predetermined priority. The priority encoder 20 contains the entry match outputs for all the words. Upon receiving an encode-start signal from the timing generating circuit 18, the priority encoder 20 outputs, for example, the address of a higher priority word. If one entry is composed of a combination of a plurality of words, the address of the entry representative word is output.

The one-word circuit 24 is now described.

Figure 5:
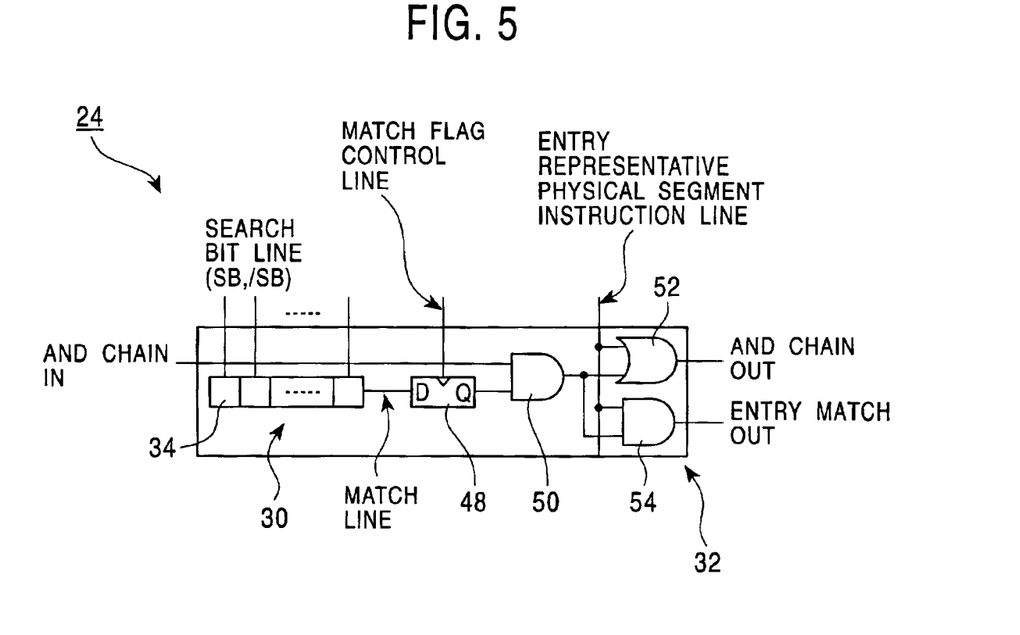
FIG. 5 is a schematic structural view of an exemplary one-word circuit.

FIG. 5 is a schematic structural diagram of an example of the one-word circuit 24.

As described above, the one-word circuit 24 includes a CAM word 30 and word logic 32, as shown in FIG. 5.

The CAM word 30 stores the data of one word, and searches for a match detection between the stored data and the search data to output a match flag which is a result of the detection to a match line. The CAM word 30 includes CAM cells 34 of m bits.

Figure 6:
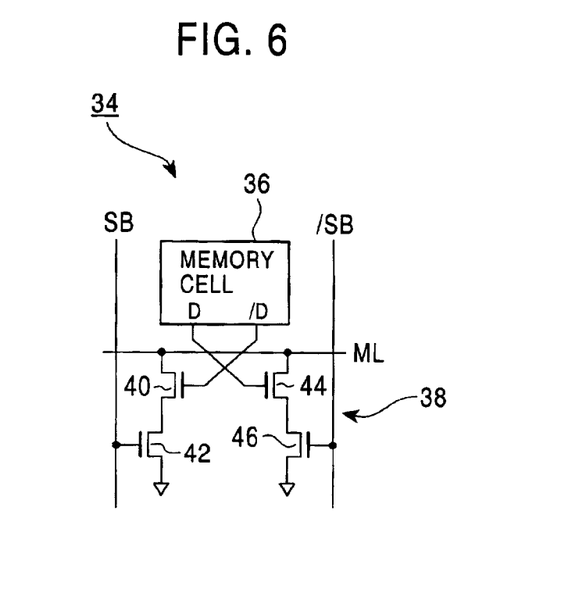
FIG. 6 is a schematic structural view of an exemplary CAM cell.

FIG. 6 is a schematic structural diagram of an example of the CAM cell 34.

The CAM cell 34 shown in FIG. 6 is a mismatch-detection CAM cell, and includes a memory cell 36 which stores the data of one bit, and a match detect circuit 38 which compares the data of one bit stored in the memory cell 36 with the search data driven on a pair of search bit lines SB and /SB to output a match flag which is a result of the comparison on a match line ML.

For simplification of illustration, the memory cell 36 in the CAM cell 34 is not specifically shown in FIG. 6, but may be implemented by any well-known SRAM cell or DRAM cell, or any various ROM cell which can store the data of one bit. In FIG. 6, a circuit for writing/reading data to/from the memory cell 36 is also omitted. This data write/read circuit may be implemented by any well-known circuit.

The match detect circuit 38 includes four NMOS (n-channel MOS) transistors 40, 42, 44, and 46. The NMOS transistors 40 and 42 are connected in series between the match line ML and the ground line, of which the gates are connected to the inverting output /D of the memory cell 36 and the search bit line SB, respectively. The NMOS transistors 44 and 46 are connected in series between the match line ML and the ground line, of which the gates are connected to the output D of the memory cell 36 and the barred search bit line /SB, respectively.

In the CAM cell 34 shown in FIG. 6, before a match search operation, the search bit lines SB and /SB are discharged in advance and the match line ML is precharged. When the search bit lines SB and /SB are driven to '10', '01', or '00' according to the search data (data 1, data 0, or Don't Care) in the match search operation, the match line ML is discharged if a mismatch is detected. If a match is detected, the match line ML is maintained in a precharged state.

There is no limitation on the configuration of the CAM cell 34, and either the mismatch-detection or match-detection CAM cell, or otherwise any well-known CAM cell, is available. Preferably, the content addressable memory 10 according to the present invention uses a mismatch-detection CAM cell because the match line in the memory block 22 of a physical segment not to be searched is maintained in the initial state (in a match state), and is not charged or discharged, thereby reducing the power consumption due to the match line.

Referring to FIG. 5, the word logic 32 in the one-word circuit 24 includes a match flag register 48 for holding the match line output from the CAM word 30, an AND gate 50 and an OR gate 52 which form an AND chain having match flags of a plurality of words coupled with each other, and an AND gate 54 serving as an entry match output circuit for outputting a result of the entry detection when one entry is composed of a combination of a plurality of words.

The match flag register 48 has the data input terminal D to which the match line output from the CAM word 30 is input, and the data latch control terminal to which the match flag control signal is input from the match flag control signal generating circuit 28 in the memory block 22 of each corresponding physical segment. In FIG. 5, once the match flag register 48 receives the match flag control signal, it captures the match line output at a timing of the rising edge.

The AND gate 50 constituting an AND chain has a first input terminal to which the output Q of the match flag register 48 is input, and a second input terminal to which the AND chain output of an adjacent word is input. Therefore, the AND gate 50 outputs a signal of logic '1' if the output from the match flag register 48 of this word indicates logic '1', or a match, and if the AND chain output from an adjacent word indicates logic '1', or a match.

The OR gate 52 which outputs an AND chain signal has a first input terminal to which the output of the AND gate 50 is input, and a second input terminal to which an entry representative physical segment instruction signal is input. The entry representative physical segment instruction signal instructs the entry representative word which outputs a match signal for the entry if one entry is composed of a combination of a plurality of words. The entry representative physical segment instruction signal indicates logic '1' if a physical segment is the entry representative word, and logic '0', otherwise.

In this embodiment, if one entry is composed of a combination of a plurality of words, the physical segment containing the word having the largest address for that entry is referred to as the entry representative physical segment. Therefore, the address of the word in the memory block 22 of the entry representative physical segment is output as a match address as a search result. Should the word having the smallest address in an entry be the entry representative word, it is only required that an AND chain be reversely directed.

As the AND chain output, an AND result of the match flags of that word and the previous word is output if that word is not the entry representative word, which is then provided for an AND chain input of the next word. On the contrary, if it is the entry representative word, logic '1' is output regardless of the AND result, and is then supplied to the AND chain input of a first one-word circuit in the next entry. In this way, the AND chain is logically separated on the basis of the entry representative word.

The AND gate 54 functioning as an entry match output circuit has a first input terminal connected to the output of the AND gate 50, and a second input terminal connected to the entry representative physical segment instruction line. Thus, as the entry match output, an AND result of the match flags of the plurality of words in an entry is output from the AND gate 54 if that word is the entry representative word. Otherwise, or if not the entry representative word, logic '0' indicating a mismatch is output.

As previously described, in the content addressable memory 10, a plurality of one-word circuits 24 (up to four in this embodiment) can be combined to form one entry. The case where one entry is composed of a combination of two words is described, by way of example.

Figure 7:
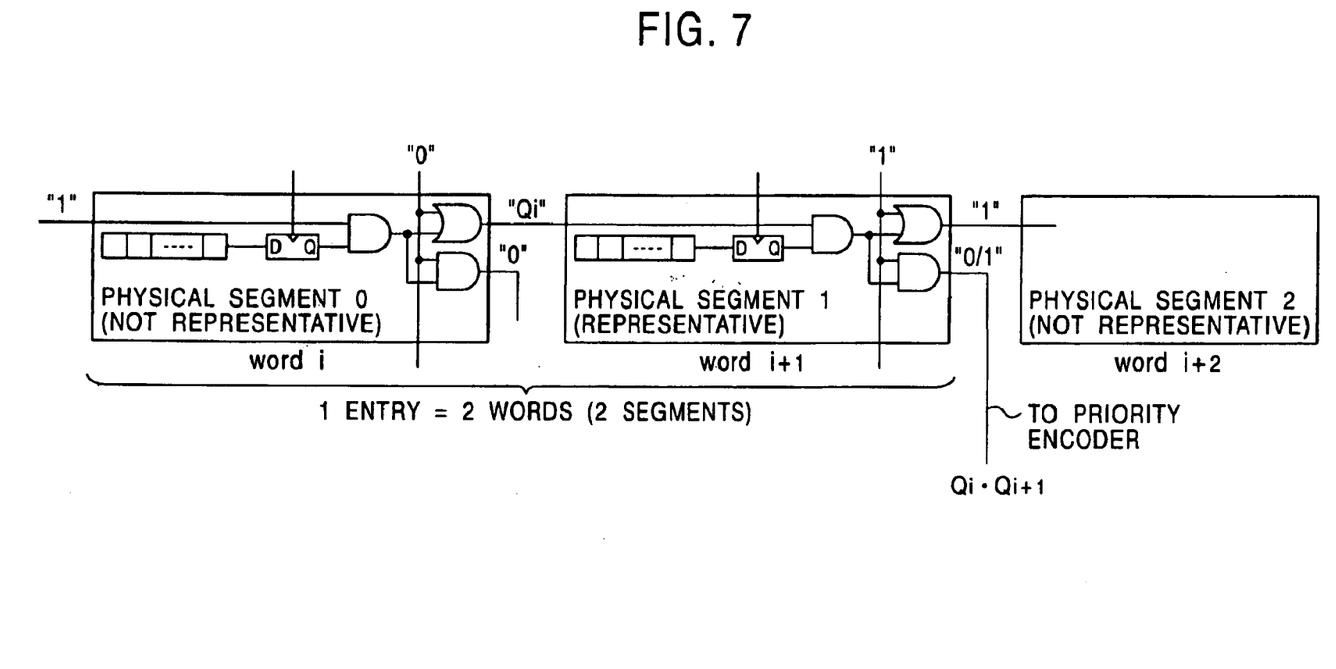
FIG. 7 is a schematic structural view of an exemplary one-word circuit in the case where one entry is composed of a combination of two words.

FIG. 7 is a schematic structural diagram of one-word circuits in the case where one entry is composed of a combination of two words.

As previously described, in this example, one entry is composed of word i and word i+1, and the word i+1 is the entry representative word. That is, entry representative physical segment instruction signals which are input to the word i and the word i+1 are set to logic '0' and logic '1', respectively.

Since word i−1 is the entry representative word of another entry, the AND chain input of the word i indicates logic '1'. As a result, as shown in FIG. 7, an AND chain is formed such that the word i and the word i+1 are logically coupled with each other. The match flag held in the match flag register 48 of the word i is propagated through the AND chain to the word i+1, and an AND result of the match flags of the word i and the word i+1 is output as the entry match output from the word i+1.

A search process in the case where one entry is composed of a combination of two words is now described with reference to the schematic structural diagram of FIG. 7.

First, an initialization unit (not shown) initializes all the match flag registers 48 to be in a match state in order to correctly propagate a series of AND search results to the entry representative word. As in this embodiment, if the CAM cell 34 is of the mismatch-detection type, since all the match lines in the memory block 11 of a physical segment not to be searched are maintained in the initial state or a match state, the match flag may be captured into the match flag register 48 at the time of a first search.

In the case of a first search (FIRST='1'), which is not reflected by the previous search result, the search bit lines in the memory block 22 of a physical segment to be searched are only driven, while the search bit lines in the memory block 22 of a physical segment not to be searched are maintained in a waiting state (both SB and /SB are set to '0' in this embodiment).

Then, a match between the data stored in the CAM words 30 and the search data is searched for at the same time in a physical segment to be searched, and a match flag is output to each corresponding match line. The match line outputs for the words belonging to a physical segment not to be searched are maintained in the initial state or a match state. Thereafter, in response to a data capture pulse applied to both match flag control signals at a timing of establishing the state of the match lines, a match line output is held in each corresponding match flag register 48.

Since the match flag registers 48 of the words belonging to a physical segment not to be searched are maintained in the initial state or a match state, even if the memory block 22 of either physical segment containing the word i or the word i+1 is to be searched for a first search, the search result can be correctly reflected to the entry match output for the entry representative word i+1. Accordingly, if one entry is composed of a combination of a plurality of words, a correct search result can be achieved if any word is first searched for a match.

In the case of an AND search (FIRST='0'), which is reflected by the previous search (first search in this embodiment) result, as in the first search, the search bit lines in a physical segment to be searched are only driven according to the search data. Thereafter, a data capture pulse is applied only to the match flag control signal of a word to be searched at a timing of establishing the state of the match lines, and a match line output is held in each corresponding match flag register 48.

In the case of an AND search, since the search result of the first search is held in the match flag register 48 of a word not to be searched, even if the memory block 22 of either physical segment containing the word i or the word i+1 is to be searched for an AND search, a correct AND search result for both can be output as the entry match output from the entry representative word i+1. Accordingly, the content addressable memory 10 according to the present invention can achieve a match search in an arbitrary order.

The aforementioned AND search result is output as the entry match output from the entry representative word. Then, the addresses of the entry representative words are sequentially output from the priority encoder 20 according to a predetermined priority.

As described above, a plurality of one-word circuits 24 are combined, and the search lines and the data capture into the match flag registers 48 are individually controlled, so that a correct AND search result can be obtained regardless of the searched order. In effect, the search bit lines and the match line of a word to be searched are only driven while the search bit lines and the match line of a word not to be searched are not driven, thereby greatly reducing the power consumption as compared to a conventional content addressable memory.

Since the match flag register 48 of a word not to be searched is maintained in the initial state or a match state, for example, if one entry is composed of a combination of four words, a match between the words of which the addresses are apart from each other in an entry can be searched, such as an AND search for a first word and a third word. This allows for a match search while distinguishing attributes of the data stored in each word, and a correct search result can be always achieved.

Although the match flag register 48 is implemented as an edge-sensitive register (which is known as a master-slave flip-flop) in the illustrated embodiment, the present invention is not limited thereto. A level-sensitive register (which is known as a latch) may also be used. In this case, as known in the art, a timing control is only required such that the latch be closed after the state of a match line has been established.

Although one entry is composed of a combination of up to four words in the illustrated embodiment, the present invention is not limited thereto, and one entry may be composed of a combination of any number of words.

While the memory block 22 of each physical segment includes the number of words corresponding to the number of entries in the illustrated embodiment, the present invention is not limited thereto, each physical segment may be divided into a plurality of blocks.

If each physical segment is divided into a plurality of memory blocks, the search bit line driver 26 and the match flag control signal generating circuit 28 may be shared by the plurality of divided memory blocks in each physical segment, or may otherwise be separately provided for each memory block so that the search bit line drivers 26 and the match flag control signal generating circuits 28 in the respective memory blocks are operated at the same timing.

The content addressable memory of the present invention basically provides the above-described features.

Although the content addressable memory according to the present invention has been described in detail, the present invention is not limited to the illustrated embodiment, and a variety of modifications or changes may be made without departing from the spirit and scope of the invention.

As described above, the content addressable memory according to the present invention allows a plurality of words constituting an entry to be searched for a match in an arbitrary order. In addition, it also allows words of which the addresses are away from each other in an entry to be searched for a match. Furthermore, in the content addressable memory according to the present invention, the search bit lines in a memory block not to be searched are not driven, thereby largely reducing the power consumption. In the content addressable memory according to the present invention which incorporates mismatch-detection CAM cells, the match line in a memory block not to be searched can be maintained in the initial state and is not charged or discharged, thereby further reducing the power consumption due to the match line.

What is claimed is:

1. A content addressable memory having a function for extending a data width, comprising:
   a plurality of memory blocks each having a plurality of CAM words, each of the plurality of memory blocks being designated a respective physical segment, the number of the physical segments being based on a maximum number of combinable words to form an entry;
   entry configuration set means for setting the number of CAM words which are combined to form an entry, arranged outside each of the memory blocks; and
   a logical-segment-to-physical-segment converting circuit for converting logical-segment-to-be searched signal that indicates a position of words to be searched to the physical-segment-to-be-searched instruction signal according to the setting of said entry configuration set means.

2. A content addressable memory according to claim 1, wherein said entry configuration set means is capable of setting the number of words which is a divisor of the maximum number of words which are combined, where the divisor includes 1 and the maximum number of words which are combined.

3. A content addressable memory according to claim 2, wherein said entry configuration set means is a register.

4. A content addressable memory according to claim 3, wherein the register is a register having a bit width corresponding to the number of said physical segments.

5. A content addressable memory according to claim 1, wherein the physical segments each comprise:
   a search bit line;
   a search bit line driver for driving the search bit line according to search data; and
   a plurality of one-word circuits, each circuit storing data of one word, and each circuit being searched for a match between the stored data and the search data driven on the search bit line to output a search result.

6. A content addressable memory according to claim 5, wherein said entry configuration set means is capable of setting the number of words which is a divisor of the maximum number of words which are combined, where the divisor includes 1 and the maximum number of words which are combined.

7. A content addressable memory according to claim 6, wherein said entry configuration set means is a register.

8. A content addressable memory according to claim 7, wherein the register is a register having a bit width corresponding to the number of said physical segments.

9. A content addressable memory according to claim 6, wherein each of the one-word circuits includes a CAM word having a plurality of CAM cells, and word logic for processing the search result output from the CAM word;
   the word logic includes a match flag register for holding the search result;

an AND chain for processing the match flag data of the plurality of words coupled to each other in an entry; and an entry match output circuit for outputting a match flag for the entry.

10. A content addressable memory according to claim 9, each of the physical segments further including a match flag control signal generating circuit for generating a match flag control signal which is a timing signal for capturing and holding the search result output from the one-word circuit.

11. A content addressable memory according to claim 10, wherein, when search operation is executed, only the search bit line in a physical segment to be searched is driven by the search bit line driver.

12. A content addressable memory according to claim 11, wherein said entry configuration set means is a register.

13. A content addressable memory according to claim 12, wherein the register is a register having a bit width corresponding to the number of said physical segments.

14. A content addressable memory having a function for storing a plurality of entries composed of a combination of a plurality of words and searching for each word of the entries, comprising:

a plurality of memory blocks each having a plurality of CAM words, each of the plurality of memory blocks being designated a respective physical segment, the number of the physical segments being based on a maximum number of combinable words to form an entry;

entry configuration set means for setting the number of CAM words which are combined to form an entry, arranged outside each of the memory blocks; and a logical-segment-to-physical-segment converting circuit for converting logical-segment-to-be searched signal that indicates a position of words to be searched to the physical-segment-to-be-searched instruction signal according to the setting of said entry configuration set means.

15. A content addressable memory according to claim 14, each physical segment including:

a search bit line;

a plurality of one-word circuits, each circuit storing data of one word, and each circuit being searched for a match between the stored data and search data driven on the search bit line to output a search result; and a search bit line driver for driving the search bit line according to the search data.

16. A content addressable memory according to claim 15, wherein, said entry configuration set means outputs entry representative physical segment instruction signal to each physical segment according to the setting of the entry configuration, and after search operation for one or more words within an entry is executed, search result output from the one-word circuit in the representative physical segment is the search result of the entry.

17. A content addressable memory according to claim 16, the word having the smallest address or the largest address within an entry is designated as representative word of the entry.

18. A content addressable memory according to claim 16, said logical-segment-to-physical-segment converting circuit outputs physical-segment-to-be-searched instruction signal to each physical segment, and the physical segment instructed to search only executes the search operation.

19. A content addressable memory according to claim 18, wherein each of the one-word circuits includes a CAM word having a plurality of CAM cells, and word logic for processing the search result output from the CAM word; the word logic further includes:

a match flag register for holding the search result;

an AND chain for processing the match flag data of the plurality of words coupled to each other in an entry; and an entry match output circuit for outputting a match flag for the entry.

20. A content addressable memory according to claim 19, wherein the CAM cells are mismatch-detection type CAM cells.

* * * * *